(12) United States Patent
Hause et al.

(10) Patent No.: US 6,555,479 B1
(45) Date of Patent: Apr. 29, 2003

(54) METHOD FOR FORMING OPENINGS FOR CONDUCTIVE INTERCONNECTS

(75) Inventors: Frederick N. Hause, Austin, TX (US); Paul R. Besser, Sunnyvale, CA (US); Frank Mauersberger, Radebeul (DE); Errol Todd Ryan, Austin, TX (US); William S. Brennan, Austin, TX (US); John A. Iacoponi, Austin, TX (US); Peter J. Beckage, Austin, TX (US)

(73) Assignee: Advanced Micro Devices, Inc., Austin, TX (US)

( * ) Notice: Subject to any disclaimer, the term of this patent is extended or adjusted under 35 U.S.C. 154(b) by 0 days.

(21) Appl. No.: 09/879,376

(22) Filed: Jun. 11, 2001

(51) Int. Cl.⁷ .......................................... H01L 21/302
(52) U.S. Cl. ...................... 438/706; 438/717; 438/723
(58) Field of Search ................. 438/624–627, 438/638–640, 672, 700, 706, 717, 723

(56) References Cited

U.S. PATENT DOCUMENTS

| | | | | |
|---|---|---|---|---|
| 4,472,240 A | * | 9/1984 | Kameyama | 156/648 |
| 5,302,477 A | * | 4/1994 | Dao et al. | 438/5 |
| 5,635,337 A | * | 6/1997 | Bartha et al. | 430/323 |
| 6,042,996 A | * | 3/2000 | Lin et al. | 438/313 |
| 6,171,732 B1 | * | 1/2001 | Chen et al. | 430/5 |

OTHER PUBLICATIONS

Wolf et al., Silicon Processing for the VLSI Era, vol. 1, 1986, pp. 182–183.*
Wolf et al., Silicon Processing for the VLSI Era, 1986, vol. 1, p. 407–408.*

* cited by examiner

*Primary Examiner*—Benjamin L. Utech
*Assistant Examiner*—Duy-Vu Deo
(74) *Attorney, Agent, or Firm*—Williams, Morgan & Amerson, P.C.

(57) ABSTRACT

A method for forming a conductive interconnect comprises forming a process layer over a structure layer and forming a mask over the process layer, the mask having an etch profile therein. An anisotropic etching process is performed to erode the mask and to form an etched region in the process layer, the etched region having a profile correlating to the etch profile. A conductive material is formed in the etched region in the process layer and any excess conductive material is removed from above an upper surface of the process layer.

48 Claims, 12 Drawing Sheets

METHOD FOR FORMING OPENINGS FOR CONDUCTIVE INTERCONNECTS

BACKGROUND OF THE INVENTION

1. Field of the Invention

The present invention is generally directed to semiconductor fabrication technology, and, more particularly, to techniques for the formation of openings in a process layer for conductive interconnects.

2. Description of the Related Art

There is a constant drive within the semiconductor industry to increase the operating speed of integrated circuit devices, e.g., microprocessors, memory devices, and the like. This drive is fueled by consumer demands for computers and electronic devices that operate at increasingly greater speeds. This demand for increased speed has resulted in a continual reduction in the size of semiconductor devices, e.g., transistors. That is, many components of a typical field effect transistor (FET), e.g., channel length, junction depths, gate dielectric thickness, and the like, are reduced. For example, all other things being equal, the smaller the channel length of the FET, the faster the transistor will operate. Thus, there is a constant drive to reduce the size, or scale, of the components of a typical transistor to increase the overall speed of the transistor, as well as integrated circuit devices incorporating such transistors. Additionally, reducing the size, or scale, of the components of a typical transistor also increases the density, and number, of the transistors that can be produced on a given amount of wafer real estate, lowering the overall cost per transistor as well as the cost of integrated circuit devices incorporating such transistors.

However, reducing the size, or scale, of the components of a typical transistor also requires reducing the size and cross-sectional dimensions of electrical interconnects to active areas, such as $N^+$ ($P^+$) source/drain regions and a doped-polycrystalline silicon (doped-polysilicon or doped-poly) gate conductor, and the like. As the size and cross-sectional dimensions of electrical interconnects get smaller, resistance increases and electromigration increases. Aluminum (Al) is frequently used for interconnects in contemporary semiconductor fabrication processes primarily because aluminum is inexpensive and easier to etch than, for example, copper (Cu). However, aluminum has poor electromigration characteristics and higher resistivity than other metals, including copper.

As a result of the difficulty in etching copper, when it is used, an alternative approach to forming vias and metal lines is typically employed. The damascene approach, both single and dual, consisting of etching openings such as trenches in the dielectric for lines and vias and creating in-laid metal patterns, is the leading contender for fabrication of sub-0.25 micron (sub-0.25µ) design rule copper-metallized (Cu-metallized) circuits.

In the damascene approach, vias, contact openings and trenches, for example, may be formed in and through dielectric layers and other process layers using known photolithography techniques. A seed layer or film of copper is then formed over the surface of the dielectric and in the openings and trenches. Thereafter, a bulk layer of copper is formed above the wafer using, for example, an electroplating process. The excess copper is then removed by polishing, grinding, and/or etching, such as by chemical/mechanical polishing, to leave only the copper in the openings or trenches, which form the copper interconnects.

One problem associated with the damascene approach arises when both trenches and vias, for example, are formed in the same process layer. Typically, the process requires forming a layer of photoresist material over the process layer and, using well-known photo-lithography techniques, patterning the photoresist layer to allow formation of openings in the dielectric layer for the vias. Thereafter, the openings are etched in the process layer, typically by way of an anisotropic etching process, and the patterned photoresist layer is then removed. A second layer of photoresist material is thereafter formed over the process layer, and this photoresist layer is patterned to allow for formation of the trenches. A second etching process, for example, a second anisotropic etching process, is performed to form the trenches in the process layer, after which the second photoresist layer is removed. Thus, while the damascene approach has numerous advantages, it typically requires additional process steps as compared to more conventional semiconductor manufacturing processes.

The present invention is directed to solving, or at least reducing the effects of, some or all of the aforementioned problems.

SUMMARY OF THE INVENTION

In one aspect of the present invention, a method is provided for forming a patterned process layer. The method comprises forming a process layer over a structure layer and forming a mask over the process layer, the mask having an etch profile therein. The method further comprises performing an anisotropic etching process to erode the mask and to form an etched region in the process layer, the etched region having a profile correlating to the etch profile.

In another aspect of the present invention, a method is provided for forming a patterned process layer. The method comprises forming a process layer above a structure layer, forming a first layer of mask material above the process layer, and forming a second layer of mask material above the first layer of mask material. The method further comprises forming an etch profile in the first and second layers of mask material and performing an anisotropic etching process to form an etched region in the process layer, the etched region having a profile correlating to the etch profile.

In yet another aspect of the present invention, a method is provided for forming a conductive interconnect. The method comprises forming a process layer over a structure layer and forming a mask over the process layer, the mask having an etch profile therein. The method further comprises performing an anisotropic etching process to erode the mask and to form an etched region in the process layer, the etched region having a profile correlating to the etch profile. The method also comprises forming a conductive material in the etched region in the process layer and removing an excess conductive material from above an upper surface of the process layer.

BRIEF DESCRIPTION OF THE DRAWINGS

The invention may be understood by reference to the following description taken in conjunction with the accompanying drawings, in which the left-most significant digit(s) in the reference numerals denote(s) the first figure in which the respective reference numerals appear, and in which.

Figure 1:
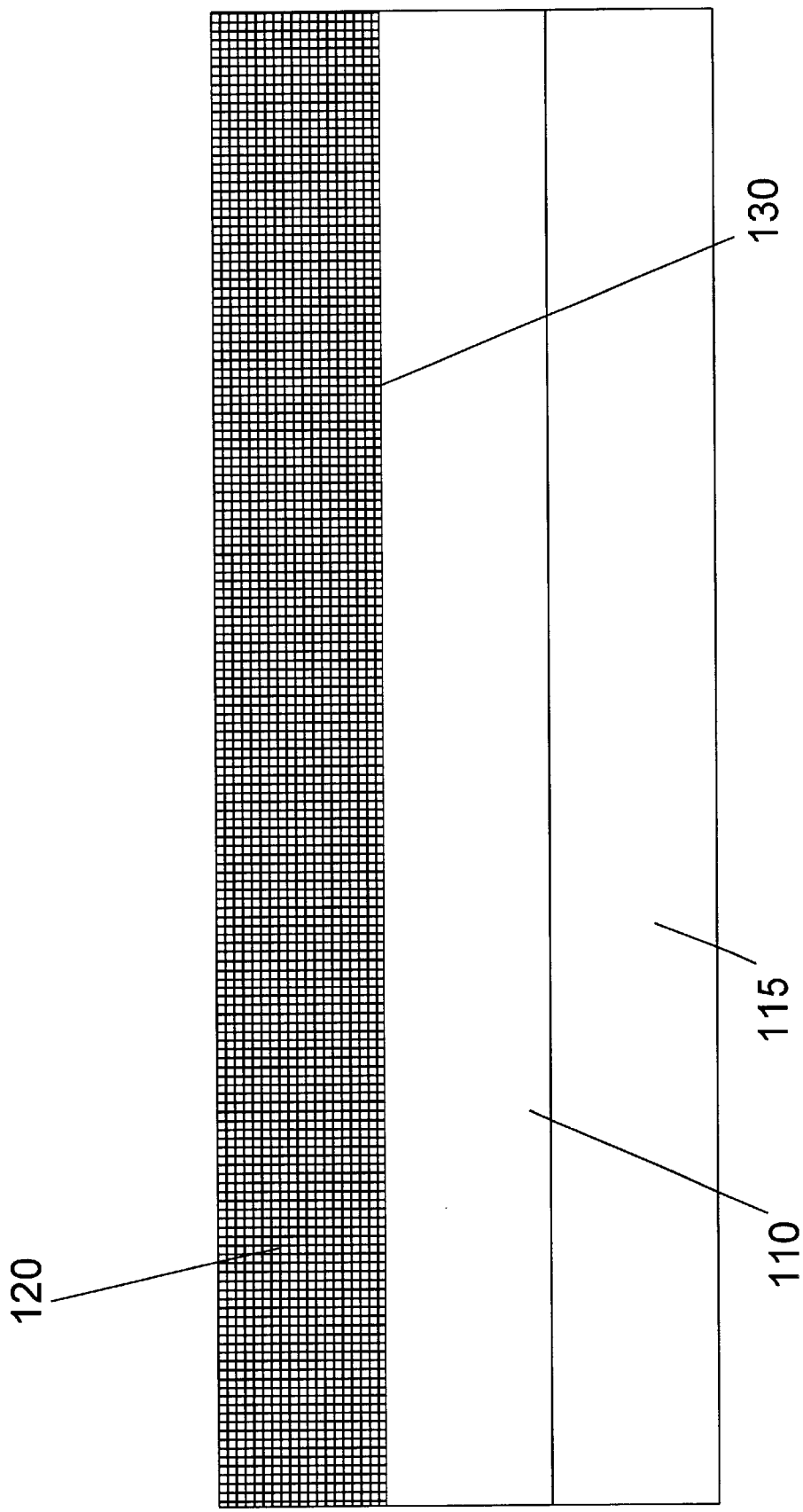
FIGS. 1–6 schematically illustrate a portion of one particular semiconductor manufacturing process according to various embodiments of the present invention.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF THE INVENTION

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

Illustrative embodiments of a method for semiconductor device fabrication according to the present invention are shown in FIGS. 1–12. Although the various regions and structures of a semiconductor device are depicted in the drawings as having very precise, sharp configurations and profiles, those skilled in the art recognize that, in reality, these regions and structures are not as precise as indicated in the drawings. Nevertheless, the attached drawings are included to provide illustrative examples of the present invention.

In general, the present invention is directed to the manufacture of conductive interconnects in a semiconductor device. As will be readily apparent to those skilled in the art upon a complete reading of the present application, the present method is applicable to a variety of technologies, for example, NMOS, PMOS, CMOS, damascene processes, and the like, and is readily applicable to a variety of devices, including, but not limited to, logic devices, memory devices, and the like.

FIGS. 1–6 schematically illustrate a portion of one particular semiconductor manufacturing process according to various embodiments of the present invention. As shown in FIG. 1, a first process layer 110, for example, a dielectric layer 110, may be formed above a structure layer 115 such as a semiconducting substrate. However, the present invention is not limited to the formation of the process layer 110 above the surface of a semiconducting substrate such as a silicon wafer, for example. Rather, as will be apparent to one skilled in the art upon a complete reading of the present disclosure, the process layer 110 may be formed above previously formed semiconductor devices and/or process layers, e.g., transistors, or other similar structures. In effect, the present invention may be used to form process layers above previously formed process layers. The structure layer 115 may be an underlayer of semiconducting material, such as a silicon substrate or wafer, or, alternatively, may be an underlayer of semiconductor devices, such as a layer of metal oxide semiconductor field effect transistors (MOSFETs), and the like, and/or a metal interconnection layer or layers and/or an interlevel (or interlayer) dielectric (ILD) layer or layers and the like.

The dielectric layer 110 may be formed from a variety of dielectric materials, including, but not limited to, silicon dioxide, silicon oxynitride, or a dielectric material having a relatively low dielectric constant (where k is less than or equal to about 4), although the dielectric materials need not have low dielectric constants. Examples include Applied Material's Black Diamond®, Novellus' Coral®, Allied Signal's Nanoglass®, JSR's LKD5104, and the like. In one illustrative embodiment, the dielectric layer 110 is comprised of Applied Material's Black Diamond®, and has a thickness of approximately 5000 Å, being formed by being blanket-deposited by an LPCVD process. The dielectric layer 110 may be formed by a variety of known techniques for forming such layers, e.g., a chemical vapor deposition (CVD) process, a low-pressure CVD (LPCVD) process, a plasma-enhanced CVD (PECVD) process, a sputtering process, a physical vapor deposition (PVD) process, a spin-on coating process (such as a spin-on glass process), and the like, and it may have a thickness ranging from approximately 3000 Å–8000 Å, for example.

Although not illustrated in FIG. 1, an anti-reflective coating (ARC) layer may be formed between the process layer 110 and the structure layer 115 and/or above the process layer 110. Such an ARC layer may comprise any material, or combination of materials, suitable for the desired function of the ARC layer. For example, the ARC layer may comprise silicon nitride, silicon oxynitride and/or any suitable organic material. An ARC layer may perform various functions, including an anti-reflective function to reduce deleterious effects of photolithography and etching processes on the resulting structure's form. Such an ARC layer may be formed by any suitable technique, including, for example, any suitable deposition technique. An ARC layer may, for example, comprise silicon nitride deposited by a PECVD process, and it may have a thickness ranging from approximately 100–1000 Å, for example.

As illustrated in FIG. 1, a layer 120 of photoresist material may be formed above an upper surface 130 of the process layer 110. In the embodiment illustrated in FIGS. 1–6, the layer 120 is a substantially homogenous layer of positive photoresist material. The layer 120 may be formed by a spin-on process, for example, to the desired thickness. For example, the layer 120 may be formed to a thickness of about 3000 to about 10,000 Å. As those of ordinary skill in the art will appreciate, upon exposure to an appropriate radiation (e.g., light of appropriate wavelengths), positive photoresist materials become soluble in the photoresist development phase of the process. Portions of the positive photoresist material that are not exposed to the radiation will be relatively insoluble in the development phase, although a portion of the unexposed photoresist material will be lost during the development phase.

Figure 2:
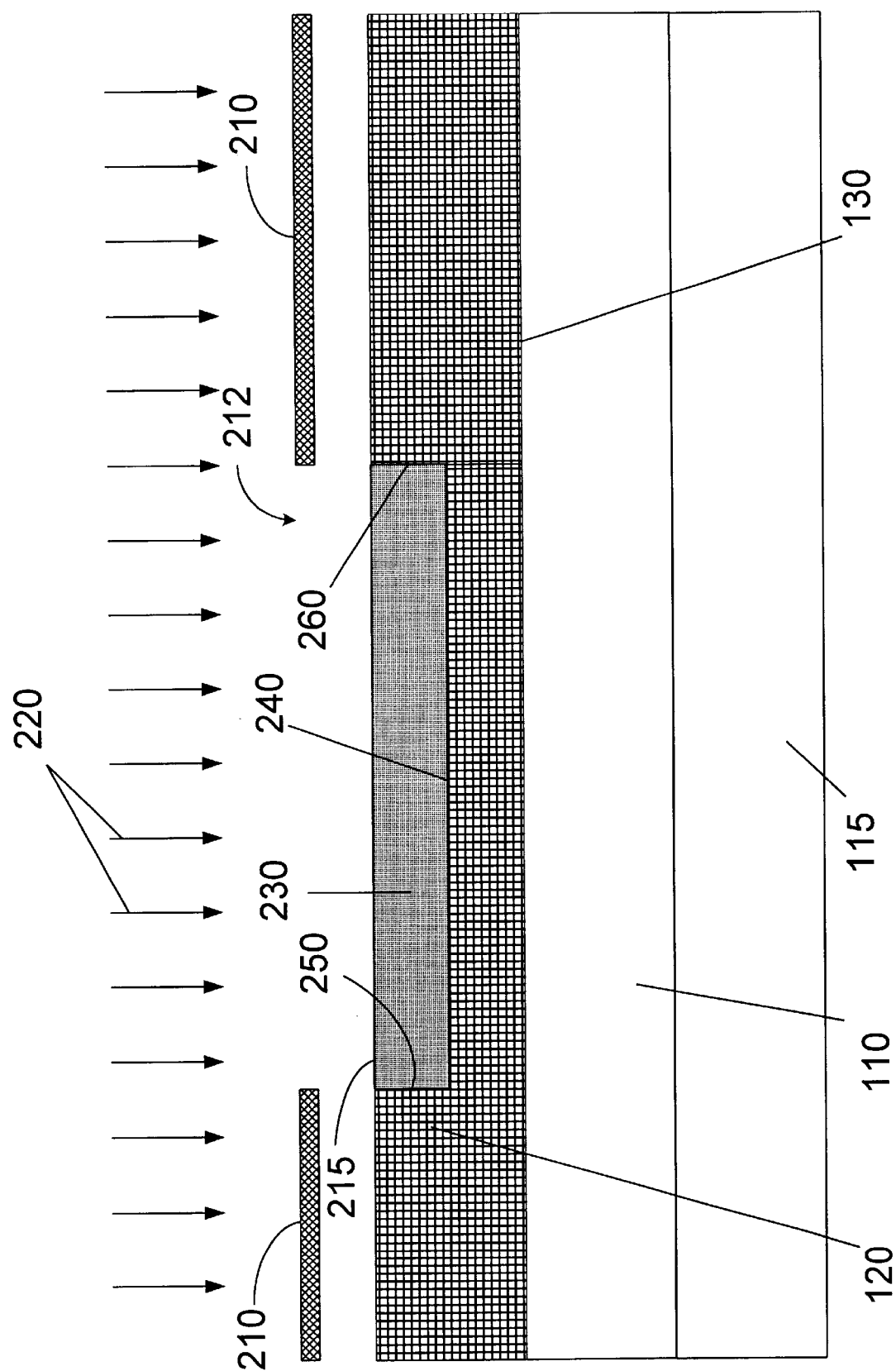

Referring now to FIG. 2, a trench reticle 210 may be positioned above the layer 120 of photoresist material in preparation for irradiating selected portions of the layer 120. The trench reticle 210 includes an opening 212 through which radiation of a first energy level may be directed. The radiation, illustrated by arrows 220 in FIG. 2, will impinge upon an exposed surface 215 of the layer 120 of photoresist material. The portions of the surface 215 and layer 120 that underlie the trench reticle 210 will be protected from the radiation. The first energy level will be chosen so as to expose the photoresist material to a predetermined, controlled depth. That is, by selecting an appropriate energy level, the radiation will affect the layer 120 of photoresist material to a level 240 as illustrated in FIG. 2. For example, a radiation having a wavelength of approximately 193 nm and an energy level of approximately 10 mJ/cm$^2$ may be used to expose the layer 120 to a depth of approximately 5300 Å. A first affected region 230 of exposed photoresist material will thus be formed in the layer 120. The lateral extent of the first region 230 will be defined by a trench boundary 250 and a trench/via boundary 260, each of which is controlled by the opening 212 in the trench reticle 210. The depth of the first affected region 230 will be defined by the level 240, which will be determined, at least in part, by the energy level of the radiation represented by the arrows 220.

Figure 3:
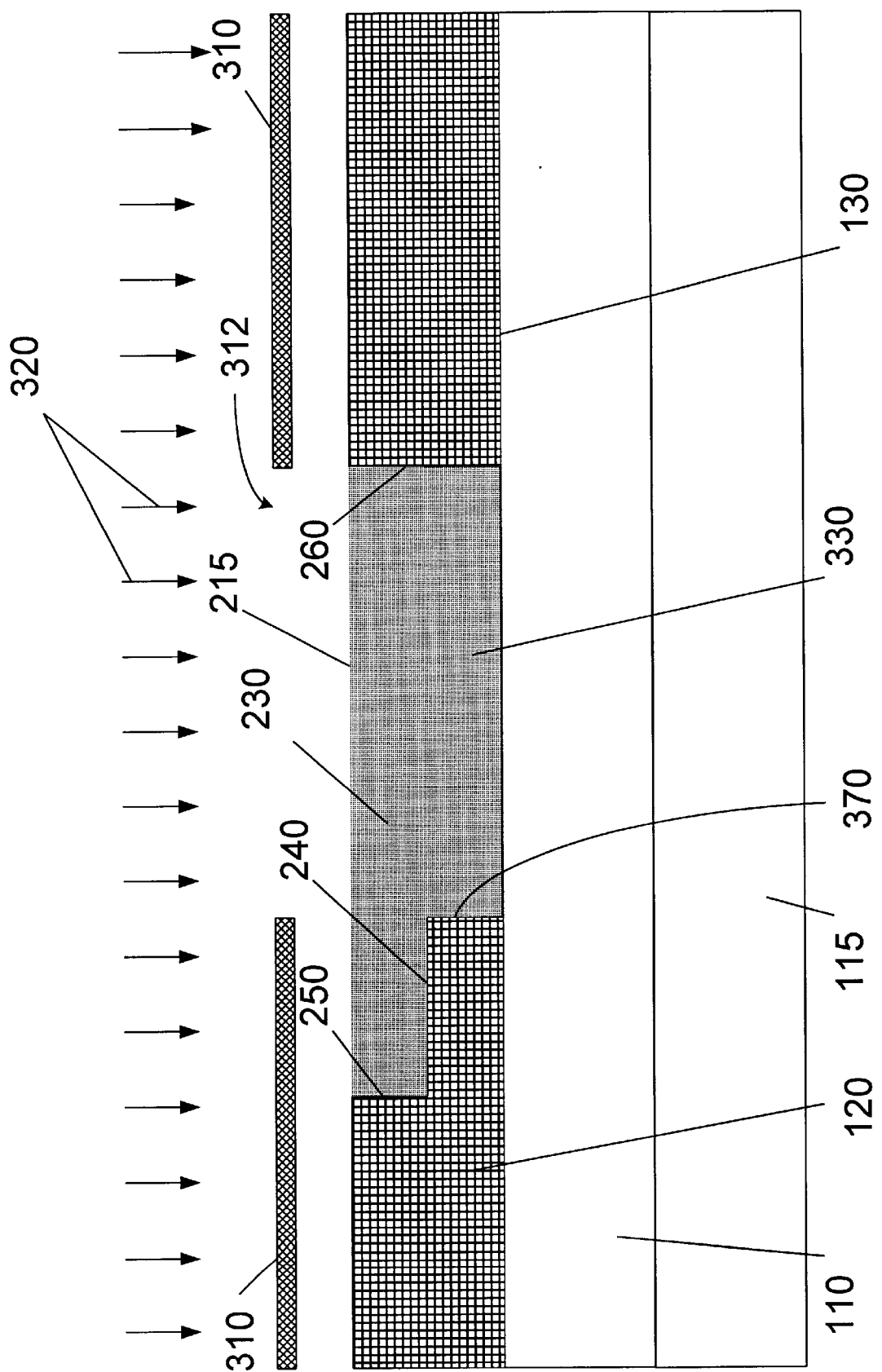

Referring now to FIG. 3, a via reticle 310 may be positioned above the layer 120 of photoresist material. The via reticle 310 includes an opening 312 therein, through which radiation of a second energy level may be directed. This second radiation, denoted by arrows 320 in FIG. 3, will impact the surface 215 of the layer 120 and may be of a sufficient energy level to expose the photoresist material substantially to the upper surface 130 of the process layer 110. For example, the second radiation may be of a wavelength of approximately 243 nm, and it may have an energy level of approximately 20 mJ/cm$^{2-}$. Thus, a second affected region 330 of photoresist may be created by this second radiation.

As illustrated in FIG. 3, the trench/via boundary 260, whose formation was begun during the first irradiation process (see FIG. 2), has been extended substantially to the upper surface 130 of the process layer 110 by the second irradiation. The second affected region 330 is bounded by a via boundary 370, the trench/via boundary 260, the prior level 240, and the upper surface 130 of the process layer 110. Preferably, the second affected region 330 will extend substantially to the upper surface 130 of the process layer 110, although at least a portion of the layer 120 underlying the affected region 330 may remain. The first and second affected regions 230, 330 together form an etch profile in the photoresist layer 120.

In the illustrative embodiment of FIGS. 1–6, the trench boundary 250 and the initial portion of the trench/via boundary 260 in the layer 120 are formed before the via boundary 370 is formed in the layer 120 and before the trench/via boundary 260 is extended substantially to the upper surface 130 of the process layer 110. However, as those of ordinary skill in the art will appreciate upon a complete reading of the present disclosure, the via boundary 370 and extended trench/via boundary 260 may be formed before the trench boundary 250 is formed. That is, the via reticle 310 may be used first to expose substantially the entire depth of the photoresist layer 120 and for a width corresponding to the opening 312 in the reticle 310. Thereafter, the trench reticle 210 may be used to expose an area of the photoresist layer 120 underlying the opening 212 for a portion of the depth of the photoresist layer 120. In the illustrative embodiment of FIGS. 1–6, the energy levels used in the via and trench exposures are controlled to form the desired etch profile in the layer 120 of photoresist material.

Figure 4:
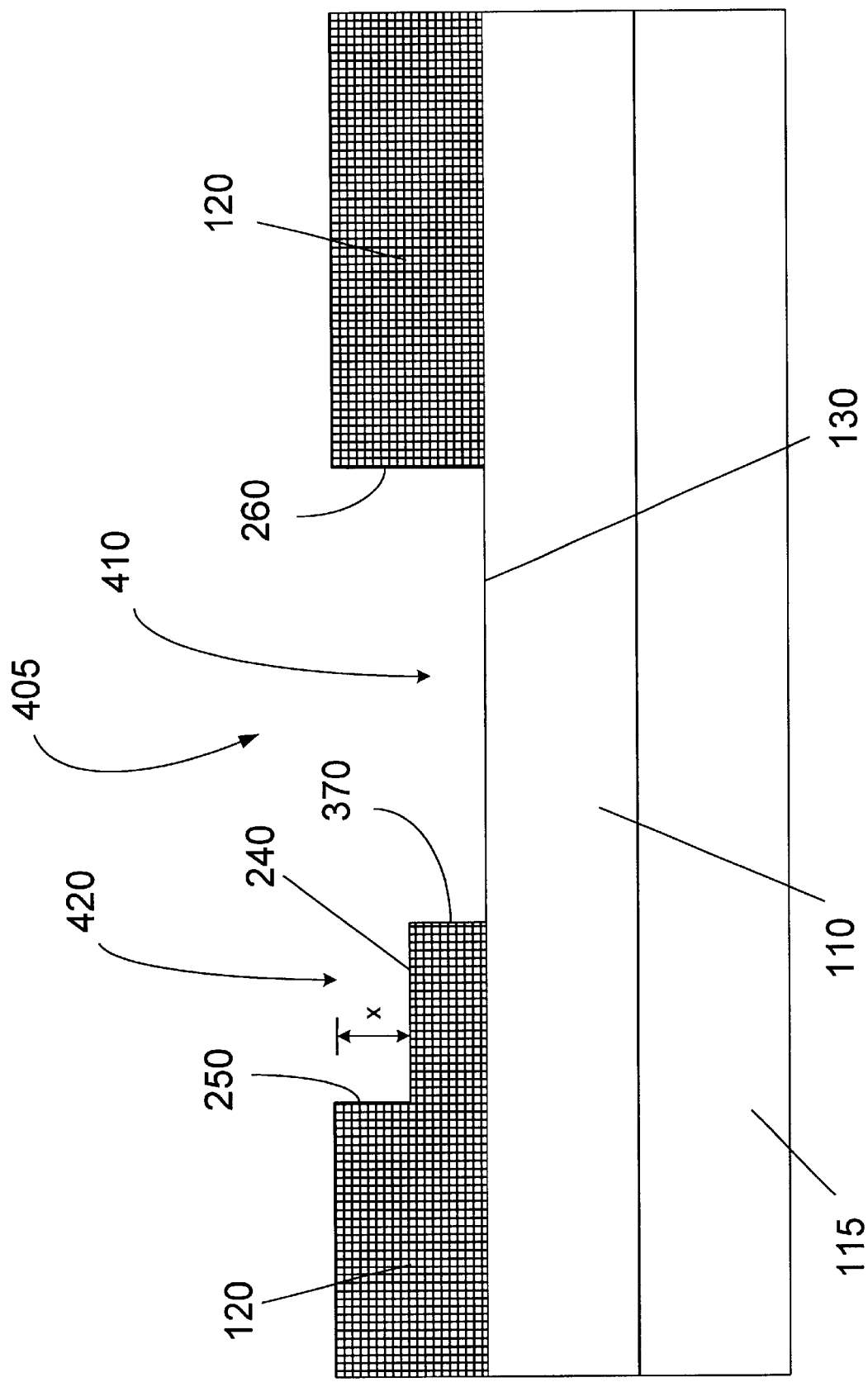

Referring now to FIG. 4, exposure of the layer 120 of positive photoresist material to the radiation processes illustrated in FIGS. 2 and 3 renders the regions 230, 330 (see FIGS. 2 and 3) relatively soluble to a variety of photoresist developer solutions available on the market. Treatment in such a solution results in the first and second affected regions 230, 330 being removed from the layer 120 of photoresist material to leave a stepped etch profile 405 in the layer 120. That is, a photoresist material mask, having a stepped etch profile 405 therein, will have been formed above the process layer 110. Thus, a via profile 410 and overlapping trench profile 420 is formed in the layer 120 of photoresist material. The depth of the trench profile 420 is designated as "x" in FIG. 4, and the via profile 410 extends through substantially the entire depth of the layer 120 to or very near the upper surface 130 of the layer 110. The depth "x" is a matter of design choice, chosen, for example, to effect the desired trench depth in the underlying process layer 110, as will be more fully explained below. For example, the depth "x" may be approximately 2000–5000 Å where the process layer 110 is approximately 4000–12,000 Å thick. As seen in FIG. 4, the width of the trench profile 420 is defined by the trench profile boundary 250 and the trench/via profile boundary 260, whereas the width of the via profile 410 is defined by the via profile boundary 370 and the trench/via profile boundary 260.

Although, in the illustrative embodiment, the trench profile 420 and the via profile 410 are both bounded on one edge by the trench/via profile boundary 260, those of ordinary skill in the art will appreciate, upon a complete reading of this disclosure, that the trench profile 420 and the via profile 410 need not share a common boundary, such as the trench/via profile boundary 260. Instead, the via profile 410 may be generally centered on, or otherwise wholly overlapped on both edges by, the trench profile 420. Alternatively, the via profile 410 and the trench profile 420 may partially overlap, or the two may not overlap at all. Numerous possibilities exist relating to the alignment and non-alignment of the via profile 410 and the trench profile 420.

Following development of the layer 120 of photoresist material, an anisotropic etching process may be performed to transfer the stepped etch profile 405 from the layer 120 of photoresist material into the process layer 110. During this anisotropic etching process, the photoresist material mask will be eroded, and a stepped etched region will be formed in the process layer 110. Any appropriate anisotropic etching process may be utilized. For example, an anisotropic etching process utilizing $CHF_3$ or $CF_4$ may be used, wherein an oxygen component has been added to the chemistry to facilitate erosion of the layer 120 of photoresist material.

Figure 5:
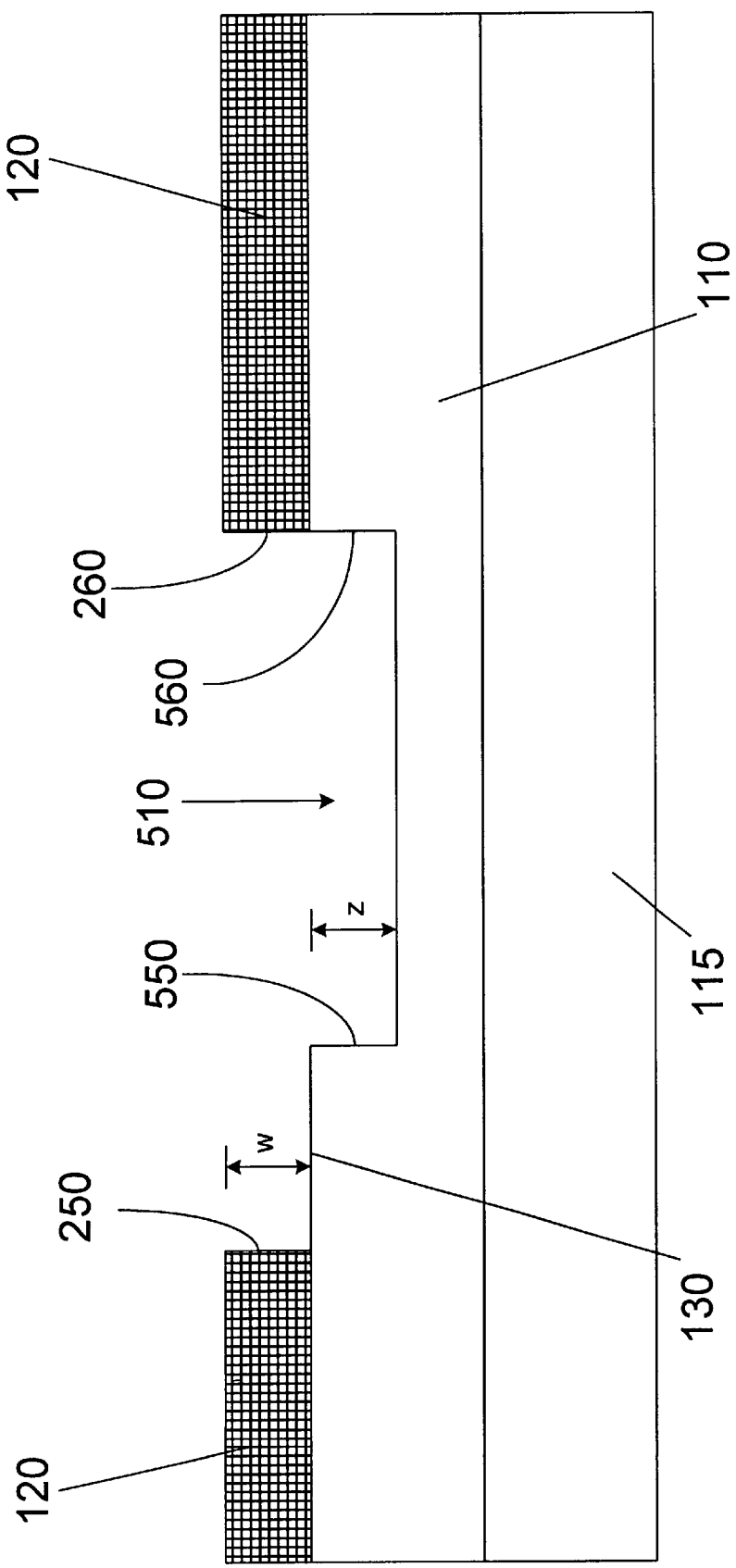

FIG. 5 illustrates a point during the anisotropic etching process. As the anisotropic etching process advances, the layer 120 of photoresist material will erode, and the process layer 110 will be etched. At a point during the anisotropic etching process, the photoresist material underlying the surface 240 (see FIG. 4) will erode entirely, exposing an additional portion of the surface 130 of the process layer 110 to the anisotropic etching chemistry. At that point in the process, a portion of the layer 120 of height "w" will remain. Also at that point in the process, the layer 110 will have been etched in the region of the via 510 to a depth of approximately "z." The relative values of "w" and "z" will be determined, at least in part, by the etch selectivity of the anisotropic etching chemistry to the photoresist material and to the material of the process layer 110. The values of "w" and "z" will be a matter of design choice and, together with the anisotropic etching chemistry, will be chosen to effect a desired final trench depth in the process layer 110. For example, the value of "w" may be approximately 2000–8000 Å, and the value of "z" may be approximately 2000–8000 Å, where the etch chemistry is $CHF_3$, $C_2F_8$ and/or $CF_4$ and the process layer 110 is silicon dioxide. At the point in the anisotropic etching process at which an additional portion of the surface 130 becomes exposed, as illustrated in FIG. 5, a via wall 550 has begun to be formed in the process layer 110, and a trench/via wall 560 has also begun to be formed in the process layer 110. The trench profile boundary 250 and the trench/via profile boundary 260 still exist in the remaining portion of the layer 120 of photoresist material.

Figure 6:
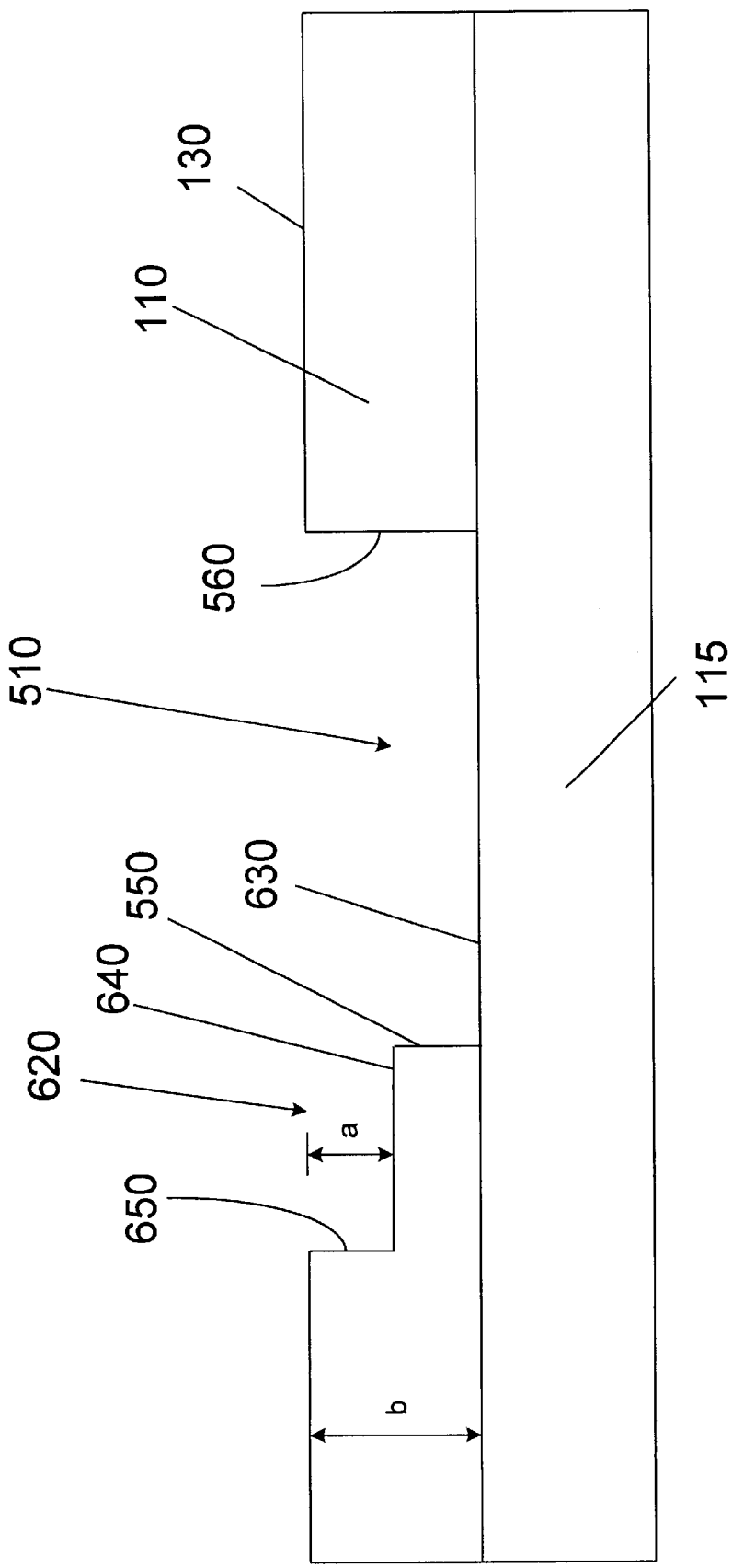

Referring now to FIG. 6, following the anisotropic etching process, the layer 120 of photoresist material may be completely or substantially eroded from above the process layer 110. Alternatively, a portion of the layer 120 may remain above the surface 130, and any remaining portion may be removed by any of a variety of known methods. The stepped trench/via etch profile 405 (FIG. 4) previously formed in the layer 120 of photoresist material will have been essentially transferred to the process layer 110 by the anisotropic etching process 520. The depth of the trench region 620 will be approximately "a," as illustrated in FIG. 6. The magnitude of the dimension "a" relative to the overall thickness "b" of the process layer 110 will be a matter of design choice. For example, the value of "a" may be approximately 2000–7000 Å, while the overall thickness "b" of the process layer 110 may be approximately 4000–12,000 Å. Moreover, the etch selectivity of the anisotropic etching process chemistry will transfer the etch profile 405 from the layer 120 to the process layer 110, although the height of the trench 620 relative to the overall thickness of the layer 120 or process layer 110 may vary, given the chemistry and selectivity of the anisotropic etching process used. The trench 620 will be defined laterally by a trench wall 650 and the trench/via wall 560. The via 510 will be defined by a via wall 560 and the trench/via wall 260. Preferably, the via 510 will extend from the plane of the surface 640 to an upper surface 630 of the structure layer 115. If an ARC layer (not shown) has been formed between the process layer 110 and the structure layer 115, it may act as an etch stop for the anisotropic etching process, for example, and it may define the lower reach of the via 510.

Following the anisotropic etching process, any remaining portion of the layer 120 of photoresist material may be removed using any suitable, known technique. Thereafter, a conductive material may be formed within the trench 620 and via 510 using any suitable technique. For example, a thin barrier metal layer and a copper seed layer (or a seed layer of another conductive material) may be applied to the surface 130, the surface 630, the surface 640, and the walls 560, 550 and 650 using vapor phase deposition. The barrier metal layer and the copper seed layer blanket-deposit the aforementioned surfaces, forming a conductive surface. Thereafter, an electroplating technique, for example, may be used to fill the trench 620 and via 510 in the process layer 110. When such a technique is utilized, the process typically forms a conformal coating of copper of a substantially constant thickness across the entire conductive surface. The copper layer may then be annealed, and the layer may be planarized using chemical mechanical polishing (CMP) techniques. For example, a CMP technique may be utilized to remove any excess copper and barrier metal from above the surface 130 of the process layer 110, thus forming a copper interconnect within the trench 620 and via 510 in the process layer 110.

Figure 7:
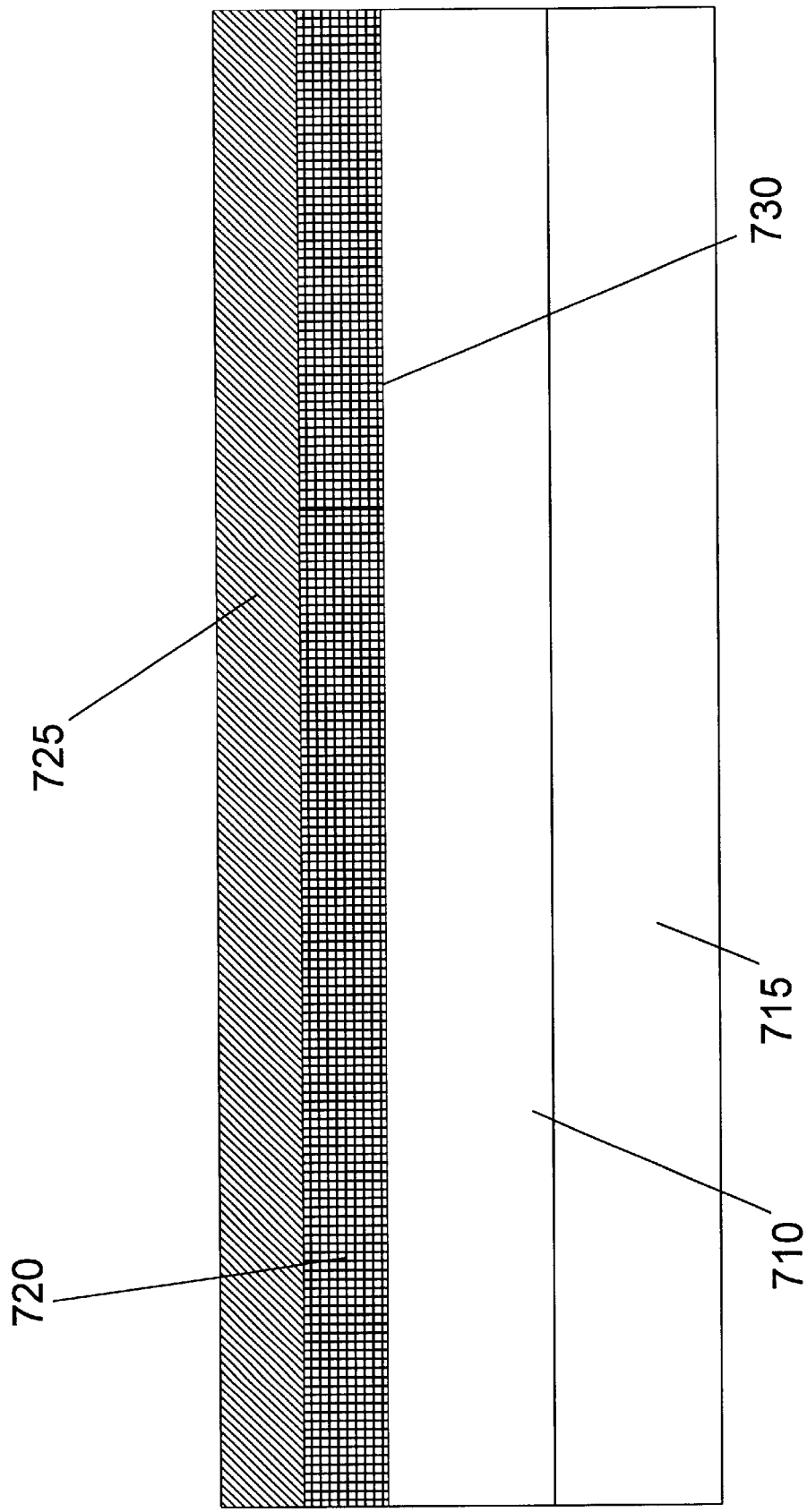
FIGS. 7–12 schematically illustrate a portion of an alternative particular semiconductor manufacturing process according to various embodiments of the present invention.

FIGS. 7–12 schematically depict a portion of an alternative illustrative semiconductor manufacturing process according to various embodiments of the present invention. As shown in FIG. 7, a first process layer 710, for example, a dielectric layer 710, may be formed above a structure layer 715 such as a semiconducting substrate. As stated above, the present invention is not limited to the formation of the process layer 710 above the surface of a semiconducting substrate such as a silicon wafer, for example. Rather, as will be apparent to one skilled in the art upon a complete reading of the present disclosure, the process layer 710 may be formed above previously formed semiconductor devices and/or process layers, e.g., transistors, or other similar structures. In effect, the present invention may be used to form process layers above previously formed process layers. The structure layer 715 may be an underlayer of semiconducting material, such as a silicon substrate or wafer, or, alternatively, may be an underlayer of semiconductor devices, such as a layer of metal oxide semiconductor field effect transistors (MOSFETs), and the like, and/or a metal interconnection layer or layers and/or an interlevel (or interlayer) dielectric (ILD) layer or layers and the like.

As mentioned earlier, the dielectric layer 710 may be formed from a variety of dielectric materials, including, but not limited to, silicon dioxide, silicon oxynitride, or a dielectric material having a relatively low dielectric constant (where k is less than or equal to about 4), although the dielectric materials need not have low dielectric constants. In the illustrative embodiment of FIGS. 7–12, the dielectric layer 710 is comprised of Applied Material's Black Diamond®, and has a thickness of approximately 5000 Å, being formed by being blanket-deposited by an LPCVD process. The dielectric layer 710 may be formed by a variety of known techniques for forming such layers, e.g., a chemical vapor deposition (CVD) process, a low-pressure CVD (LPCVD) process, a plasma-enhanced CVD (PECVD) process, a sputtering process, a physical vapor deposition (PVD) process, a spin-on coating process (such as a spin-on glass process), and the like, and it may have a thickness ranging from approximately 3000 Å–8000 Å, for example.

Although not illustrated in FIG. 7, an anti-reflective coating (ARC) layer may be formed between the process layer 710 and the structure layer 715 and/or above the process layer 710. Such an ARC layer may comprise any material, or combination of materials, suitable for the desired function of the ARC layer. For example, the ARC layer may comprise silicon nitride, silicon oxynitride and/or any suitable organic material. An ARC layer may perform various functions, including an anti-reflective function to reduce deleterious effects of photolithography and etching processes on the resulting structure's form. Such an ARC layer may be formed by any suitable technique, including, for example, any suitable deposition technique. An ARC layer may, for example, comprise silicon nitride deposited by a PECVD process, and it may have a thickness ranging from approximately 100–1000 Å, for example.

As illustrated in FIG. 7, a first layer 720 of photoresist material may be formed above an upper surface 730 of the process layer 710. In the embodiment illustrated in FIGS. 7–12, the first layer 720 is a layer of positive photoresist material. Above the first layer 720, a second layer 725 of photoresist material may be formed. The second layer 725 may also be a layer of positive photoresist. Although the first and second layers 720, 725 in this illustrative embodiment have been formed using different photoresist materials, they need not be formed from different materials. Each of the first layer 720 and second layer 725 may be formed by a spin-on process, for example, to a desired thickness. For example, the layer 720 may be formed to a thickness of about 2000–5000 Å, and the layer 725 may be formed to a thickness of about 2000–5000 Å.

Figure 8:
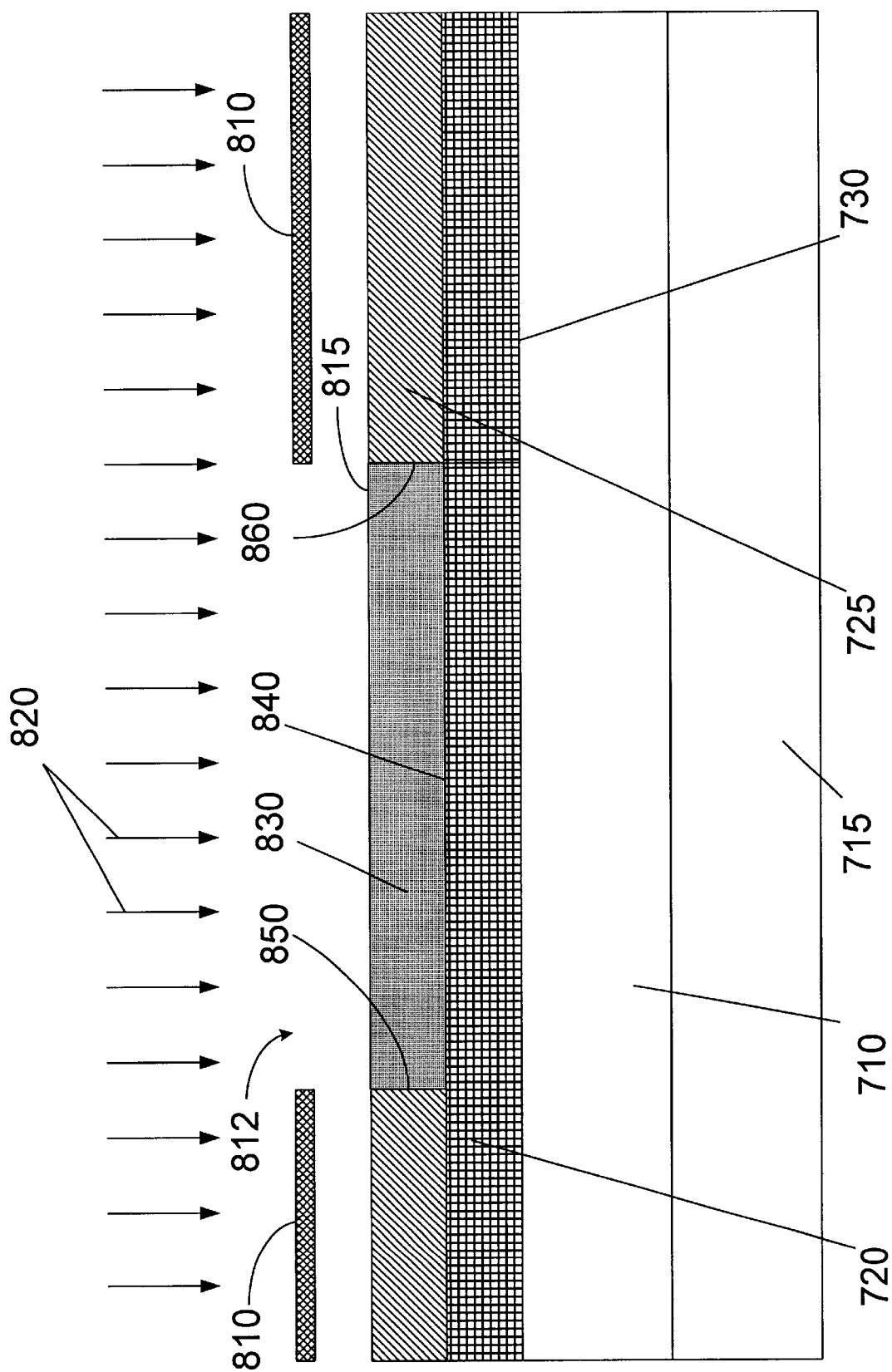

Referring now to FIG. 8, a trench reticle 810 may be positioned above the first and second layers 720, 725 of photoresist materials in preparation for irradiating selected portions of the first layer 720 and/or the second layer 725. The trench reticle 810 includes an opening 812 through which radiation of a first selected wavelength range may be directed. The radiation, illustrated by arrows 820, will impinge upon an exposed portion of the surface 815 of the second layer 725 of photoresist material. The portions of the surface 815 and layers 720, 725 that underlie the trench reticle 810 will be protected from the radiation. In this particular illustrative embodiment, the first selected wavelength range has been chosen so as to expose and affect the photoresist material of the second layer 725 of photoresist material underlying the opening 812. That is, by selecting an appropriate wavelength range, the radiation will affect the second layer 725 of photoresist material to an interface 840 between the first and second layers 720, 725 as illustrated in FIG. 8. A first region 830 of exposed photoresist material will be formed in the second layer 725. The lateral extent of the first region 830 will be defined by a trench boundary 850 and a trench/via boundary 860, each of which is controlled by the opening 812 in the trench reticle 810. The first region 830 extends through substantially the entire length of the second layer 725.

By appropriate selection of the photoresist materials used to form the first layer 720 and second layer 725 and selection of the first selected wavelength range, the second layer 725 of photoresist material will be affected, while the underlying first layer 720 will not be affected. As those of ordinary skill in the art will appreciate, different photoresist materials will be sensitive to different wavelengths of radiation. Thus, a first photoresist material for the first layer 720 may be sensitive to a first radiation wavelength range, while a second photoresist material for the second layer 725 may be sensitive to a second, different radiation wavelength range. For example, in the illustrative embodiment of FIGS. 7–12, the, first layer 720 may be formed using a photoresist material that is sensitive to radiation of about 193 nm wavelength. The second layer 725 may be formed using a photoresist material that is sensitive to radiation of about 243 nm wavelength. Numerous other combinations of photoresist materials may also be employed. Moreover, if the photoresist materials of the first and second layers 720, 725 are sensitive to radiation of the same or overlapping wavelength ranges, the energy levels, rather than the wavelengths, of the radiation used to expose the layers 720, 725 to form the trenches and vias (see below) may be controlled, as in the case of the embodiment of FIGS. 1–6.

Figure 9:
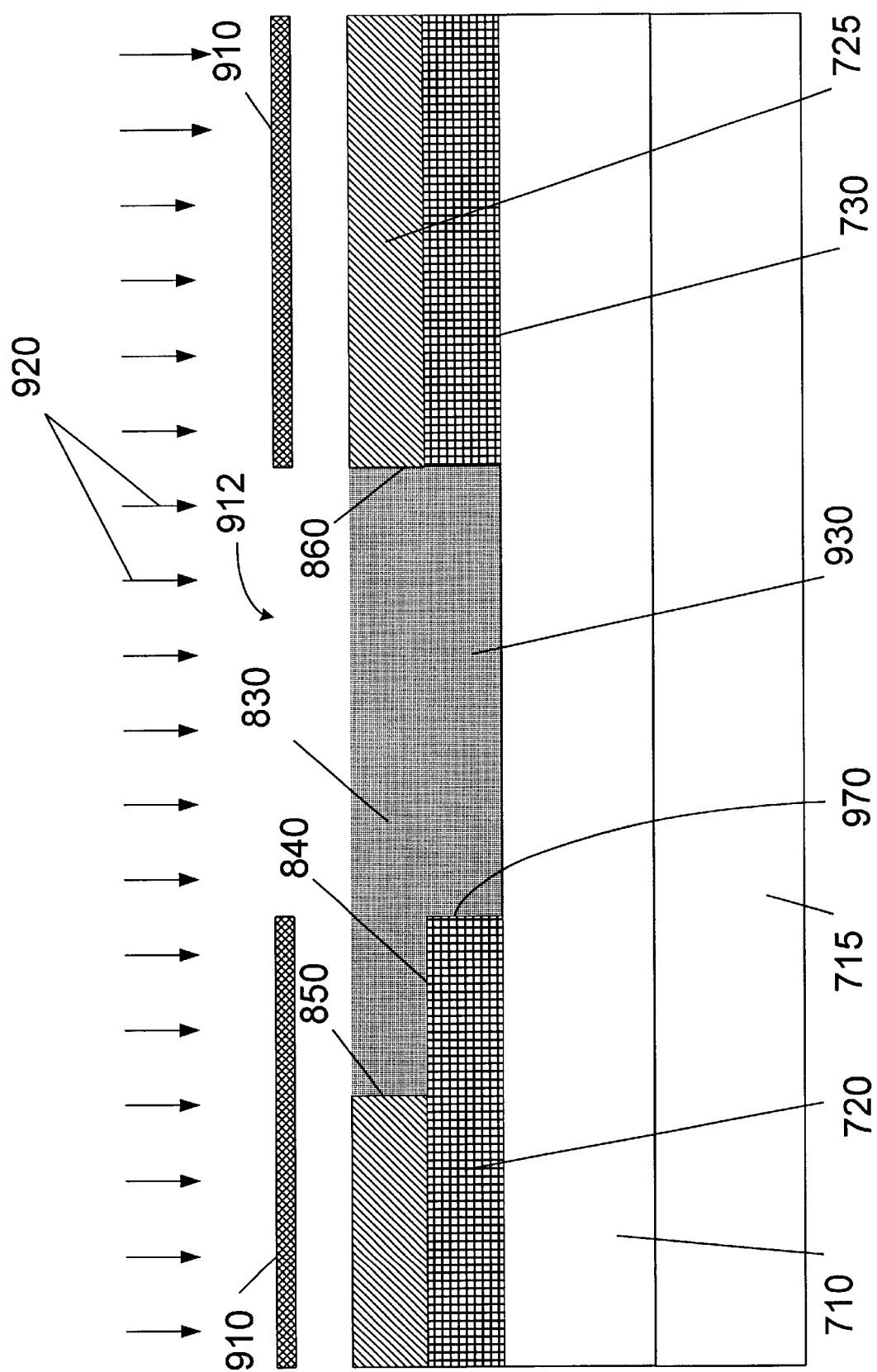

Referring now to FIG. 9, a via reticle 910 may be positioned above the first and second layers 720, 725 of photoresist materials. The via reticle 910 includes an opening 912 therein, through which radiation of a second selected wavelength range may be directed. This second radiation, denoted by arrows 920, may be of an appropriate wavelength range to expose and affect the photoresist material of the first layer 720. For example, the second radiation may be of a wavelength of approximately 243 nm, and it may have an energy level of approximately 20 mJ/cm$^2$. Thus, a second affected region 930 of photoresist will be created by this second radiation.

As illustrated in FIG. 9, the trench/via boundary 860, whose formation was begun during the first irradiation process (FIG. 8), has been extended substantially to the upper surface 730 of the process layer 710 by the second radiation. The second affected region 930 is bounded by a via boundary 970, the trench/via boundary 860, the interface 840, and the upper surface 730 of the process layer 710. Preferably, the second affected region 930 will extend substantially to the upper surface 730 of the process layer 710, although at least a portion of the layer 720 underlying the second affected region 930 may remain. The first and second affected regions 830, 930 together form an etch profile in the layers 720, 725.

In the illustrative embodiment of FIGS. 7–12, the trench boundary 850 and the initial portion of the trench/via boundary 860 in the second layer 725 are formed before the via boundary 970 is formed in the first layer 720 and before the trench/via boundary 860 is extended substantially to the upper surface 730 of the process layer 710. However, as those of ordinary skill in the art will appreciate upon a complete reading of the present disclosure, and as pointed out in connection with the embodiment of FIGS. 1–6, the via boundary 970 and extension of the trench/via boundary 860 may be formed before the trench boundary 850 is formed. In the illustrative embodiment of FIGS. 7–12, the radiation wavelength ranges used in the via and trench exposures are controlled to form the desired etch profile in the layers 720, 725 of photoresist materials.

Figure 10:
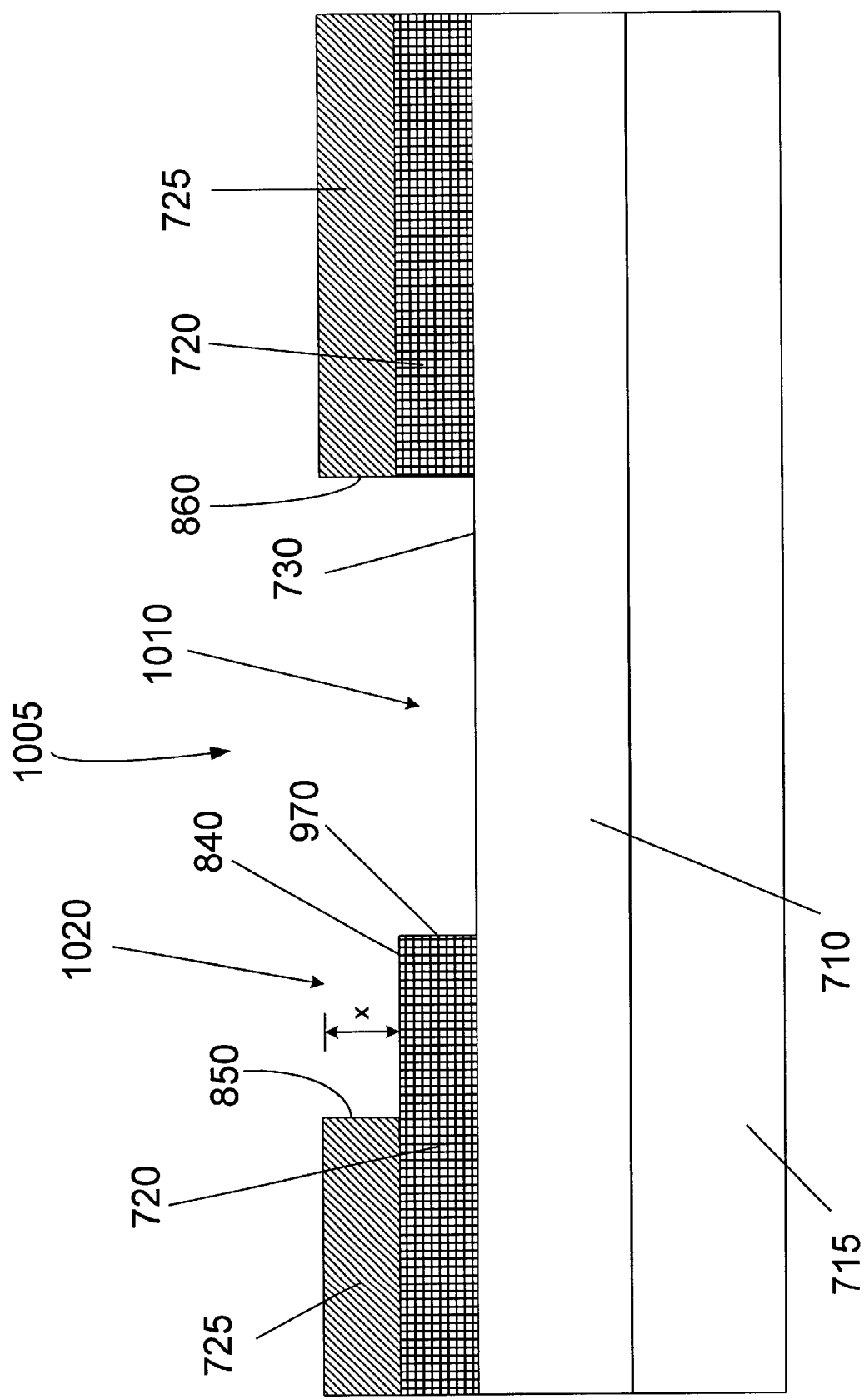

Referring now to FIG. 10, exposure of the first and second layers 720, 725 of positive photoresist materials to the radiation illustrated in FIGS. 8 and 9 renders the regions 830, 930 relatively soluble in the photoresist developer solution. Treatment in this solution results in the second and first affected regions 930, 830 being removed from the first and second layers 720, 725 of photoresist materials, respectively, to leave a stepped etch profile 1005 in the layers 720, 725. That is, a photoresist material mask, having a stepped etch profile 1005 therein, will have been formed above the process layer 710. Thus, a via profile 1010 and overlapping trench profile 1020 is formed in the layers 725, 720 of photoresist materials. The depth of the trench profile 1020 is designated as "x" in FIG. 10, and the via profile 1010 extends through substantially the entire depth of the first and second layers 720, 725 to or very near the upper surface 730 of the layer 710. The depth "x" is substantially equal, in the illustrative embodiment, to the thickness of the layer 725. Alternatively, the depth "x" may be a matter of design choice, chosen, for example, to effect the desired trench depth in the underlying process layer 710. As seen in FIG. 10, the width of the trench profile 1020 is defined by the trench profile boundary 850 and the trench/via profile boundary 860, whereas the width of the via profile 1010 is defined by the via profile boundary 970 and the trench/via profile boundary 860.

Following development of the layers 720, 725 of photoresist materials, an anisotropic etching process may be performed to transfer the stepped etch profile 1005 from the layers 720, 725 of photoresist materials into the process layer 710. During this anisotropic etching process, the photoresist material mask will be eroded and a stepped etched region will be formed in the process layer 710. Any appropriate anisotropic etching process may be utilized. For example, an anisotropic etching process utilizing $CHF_3$ or $CF_4$ may be used, wherein an oxygen component has been added to the chemistry to facilitate erosion of the first and second layers 720, 725 of photoresist materials.

Figure 11:
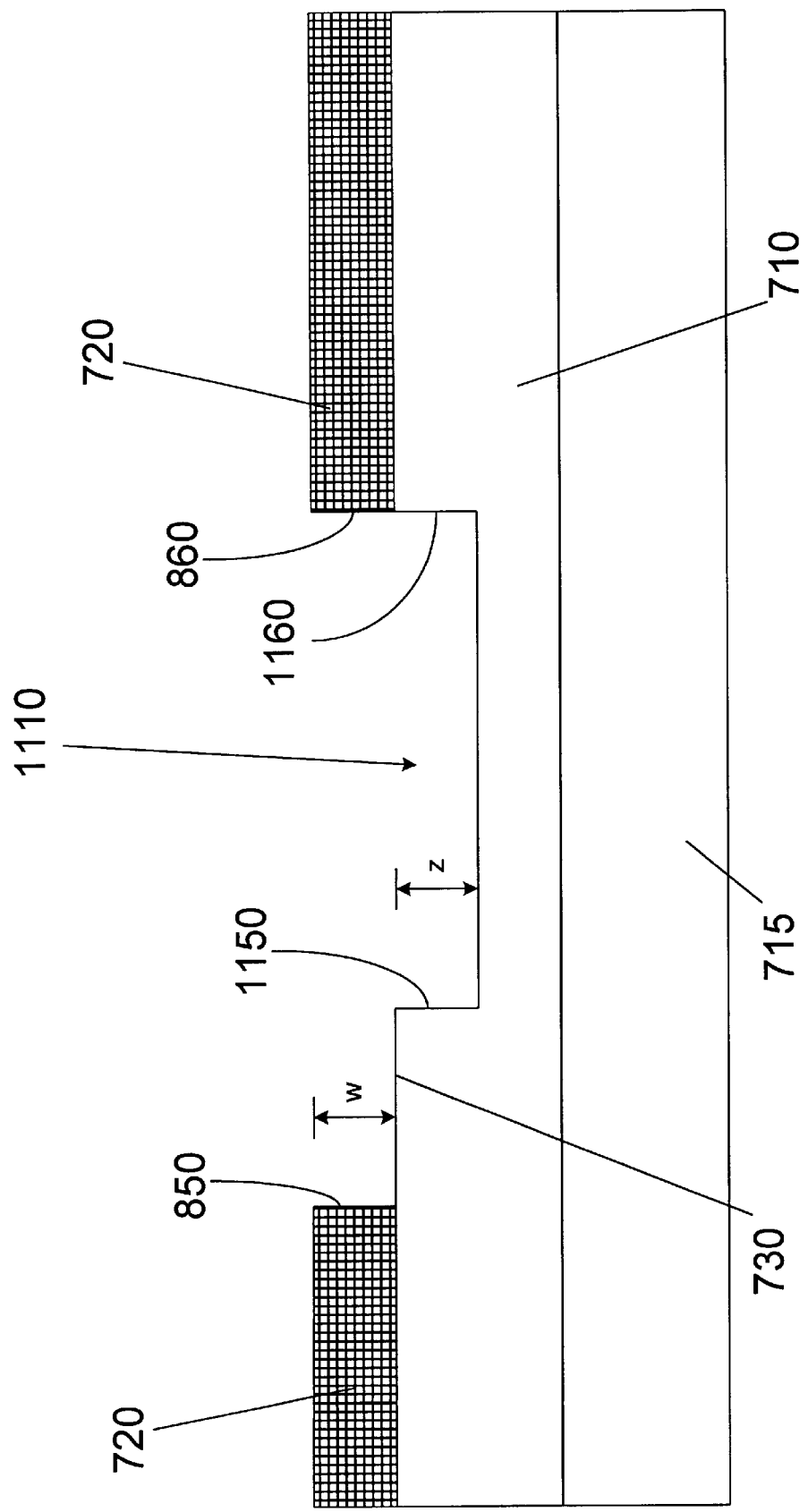

FIG. 11 illustrates a point during the anisotropic etching process. As the anisotropic etching process advances, the layers 720, 725 of photoresist materials will erode, and the process layer 710 will be etched. At a point during the anisotropic etching process, the portion of the first layer 720 of photoresist material underlying the trench profile 1010 (see FIG. 10) will erode entirely, exposing an additional portion of the surface 730 to the anisotropic etching chemistry. At that point in the process, at least a substantial portion of the second layer 725 will also have eroded, with only a portion of photoresist material of total height "w" remaining. This total height will include at least a portion of the first layer 720 of photoresist material and may include a portion of the second layer 725, as well. Also at that point in the process, the process layer 710 will have been etched in the region of the via 1110 to a depth of approximately "z." The relative values of "w" and "z" will be determined, at least in part, by the etch selectivity of the anisotropic etching chemistry to the layers 720, 725 of photoresist materials and to the material of the process layer 710. The values of "w" and "z" will be a matter of design choice and, together with the anisotropic etching chemistry, will be chosen to effect a desired final trench depth in the process layer 710. For example, the value of "w" may be approximately 2000–7000 Å, and the value of "z" may be approximately 2000–7000 Å, where the etch chemistry is $CHF_3$, $C_2F_8$ and/or $CF_4$ and the process layer 710 is a silicon dioxide. At the point in the anisotropic etching process at which an additional portion of the surface 730 becomes exposed, as illustrated in FIG. 11, a via wall 1150 has begun to be formed in the process layer 710, and a trench/via wall 1160 has also begun to be formed in the process layer 710. The trench profile boundary 850 and the trench/via profile boundary 860 still exist in the first layer 720 (and possibly in a portion of the second layer 725) of photoresist material.

Figure 12:
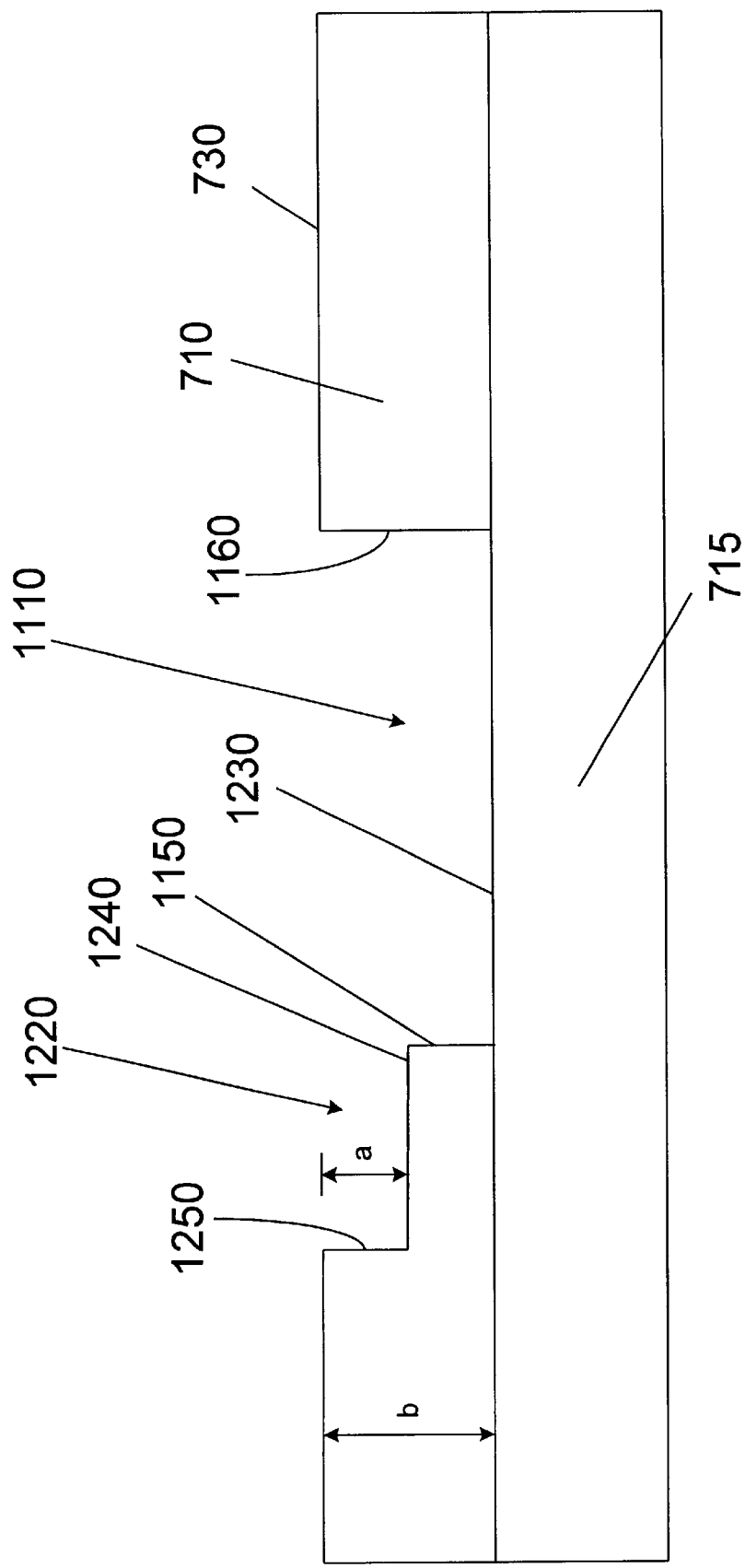

Referring now to FIG. 12, following the anisotropic etching process, the layer 720 of photoresist material may be completely or substantially eroded from above the process layer 710. Alternatively, a portion of the layer 720 may remain above the surface 730, and any remaining portion may be removed using any of a variety of known methods. The stepped etch profile 1005 (FIG. 10) previously formed in the layers 720, 725 of photoresist materials will have been essentially transferred to the process layer 710 by the anisotropic etching process. The depth of the trench region 1220 will be approximately "a," as illustrated in FIG. 12. The magnitude of the dimension "a" relative to the overall thickness "b" of the process layer 710 will be a matter of design choice. For example, the value of "a" may be approximately 2000–7000 Å, while the overall thickness "b" of the process layer 710 may be approximately 4000–12,000 Å. Moreover, the etch selectivity of the anisotropic etching process chemistry will transfer the etch profile 1005 from the layers 720, 725 to the process layer 710, although the height of the trench 1220 relative to the overall thickness of the layer 725 or process layer 710 may vary, given the chemistry and selectivity of the anisotropic etching process used. The trench 1220 will be defined by a trench wall 1250 and the trench/via wall 1160. The via 1110 will be defined by the via wall 1150 and the trench/via wall 1160. Preferably, the via 1110 will extend from the plane of the surface 840 to an upper surface 1230 of the structure layer 715. If an ARC layer (not shown) has been formed between the process layer 710 and the structure layer 715, it may act as an etch stop for the anisotropic etching process, and it may define the lower reach of the via 1110.

Following the anisotropic etching process, any remaining portion of the first layer 720 of photoresist material may be removed using any suitable, known technique. Thereafter, a conductive material may be formed within the trench 1220 and via 1110 using any suitable technique. For example, a thin barrier metal layer and a copper seed layer (or a seed layer of another conductive material) may be applied to the surface 730, the surface 1230, the surface 1240, and the walls 1160, 1150 and 1250 using vapor phase deposition. The barrier metal layer and the copper seed layer blanket-deposit the aforementioned surfaces, forming a conductive surface. Thereafter, an electroplating technique, for example, may be used to fill the trench 1220 and via 1110 in the process layer 710. When such a technique is utilized, the process typically forms a conformal coating of copper of a substantially constant thickness across the entire conductive surface. The copper layer may then be annealed, and the layer may be planarized using chemical mechanical polishing (CMP) techniques. For example, a CMP technique may be utilized to remove any excess copper and barrier metal from above the surface 730 of the process layer 710, thus forming a copper interconnect within the trench 1220 and via 1110 in the process layer 710.

The particular embodiments disclosed above are illustrative only, as the invention may be modified and practiced in different but equivalent manners apparent to those skilled in the art having the benefit of the teachings herein. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method for forming a patterned process layer, comprising:

forming a process layer over a structure layer;

forming a mask over the process layer, the mask having a stepped etch profile formed therein by irradiating at least a portion of the mask with radiation of at least a first and second selected energy range generated by a radiation source, wherein forming the mask over the process layer comprises forming a layer of photoresist material over the process layer and forming a stepped etch profile in the layer of photoresist material; and performing an anisotropic etching process to erode the mask and to form a stepped etched region in the process layer, the stepped etched region having a profile correlating to the stepped etch profile.

2. The method of claim 1, wherein forming a process layer over a structure layer comprises forming a process layer of a dielectric material over a structure layer.

3. The method of claim 2, wherein the dielectric material comprises at least one of silicon dioxide and silicon oxynitride.

4. The method of claim 1, wherein the photoresist material comprises a positive photoresist material.

5. The method of claim 1, wherein the stepped etch profile comprises a via etch profile and a trench etch profile.

6. The method of claim 5, wherein the via etch profile overlaps the trench etch profile.

7. A method for forming a patterned process layer, comprising:

forming a process layer over a structure layer;

forming a layer of mask material over the process layer;

irradiating at least a portion of the layer of mask material with radiation of a first selected energy range generated by a radiation source to form a first affected region in the layer of mask material;

irradiating at least a portion of the layer of mask material with radiation of a second selected energy range generated by the radiation source to form a second affected region in the layer of mask material;

removing the first and second affected regions from the layer of mask material to form an etch profile; and performing an anisotropic etching process to erode the layer of mask material and to form an etched region in the process layer, the etched region having a profile correlating to the etch profile.

8. The method of claim 7, wherein forming a process layer over a structure layer comprises forming a process layer of a dielectric material over a structure layer.

9. The method of claim 8, wherein the dielectric material comprises at least one of silicon dioxide and silicon oxynitride.

10. The method of claim 7, wherein forming a layer of mask material over the process layer comprises forming a layer of photoresist material over the process layer.

11. The method of claim 10, wherein the photoresist material comprises a positive photoresist material.

12. The method of claim 7, wherein removing the first and second affected regions from the layer of mask material to form an etch profile comprises:

removing the first affected region from the layer of mask material to form a via etch profile; and removing the second affected region from the layer of mask material to form a trench etch profile.

13. The method of claim 7, wherein removing the first and second affected regions from the layer of mask material to form an etch profile comprises:

removing the first affected region from the layer of mask material to form a trench etch profile; and removing the second affected region from the layer of mask material to form a via etch profile.

14. The method of claim 7, wherein removing the first and second affected regions from the layer of mask material to form an etch profile comprises:

removing the first affected region from the layer of mask material to form a via etch profile; and removing the second affected region from the layer of mask material to form a trench etch profile.

15. The method of claim 7, wherein the etch profile comprises a via etch profile and a trench etch profile.

16. The method of claim 15, wherein the via etch profile overlaps the trench etch profile.

17. A method for forming a patterned process layer, comprising:

forming a process layer above a structure layer;

forming a first layer of mask material above the process layer;

forming a second layer of mask material above the first layer of mask material;

forming an etch profile in at least the first layer of mask material after forming the second layer of mask material; and performing an anisotropic etching process to form an etched region in the process layer, the etched region having a profile correlating to the etch profile.

18. The method of claim 17, wherein forming a process layer above a structure layer comprises forming a process layer of a dielectric material above a structure layer.

19. The method of claim 18, wherein the dielectric material comprises at least one of silicon dioxide and silicon oxynitride.

20. The method of claim 17, wherein forming a first layer of mask material above the process layer comprises forming a first layer of photoresist material above the process layer.

21. The method of claim 20, wherein forming a second layer of mask material above the process layer comprises forming a second layer of photoresist material above the process layer.

22. The method of claim 20, wherein the first layer of photoresist material comprises a first layer of positive photoresist material.

23. The method of claim 21, wherein the first and second layers of photoresist material comprise first and second layers of positive photoresist material.

24. The method of claim 17, wherein forming an etch profile in the first and second layers of mask material comprises:

irradiating at least a portion of the first layer of mask material to form a first affected region in the layer of mask material;

irradiating at least a portion of the second layer of mask material to form a second affected region in the layer of mask material, the first and second affected regions defining an etch profile in the first and second layers of mask material.

25. The method of claim 24, wherein irradiating at least a portion of the first layer of mask material to form a first affected region in the layer of mask material comprises irradiating at least a portion of the first layer of mask material with radiation of a first selected energy range to form a first affected region to a preselected first depth in the first layer of mask material.

26. The method of claim 25, wherein irradiating at least a portion of the second layer of mask material to form a second affected region in the second layer of mask material comprises irradiating at least a portion of the second layer of mask material with radiation of a second selected energy range to form a second affected region to a preselected second depth in the second layer of mask material.

27. The method of claim 24, wherein irradiating at least a portion of the first layer of mask material to form a first affected region in the first layer of mask material comprises irradiating at least a portion of the first layer of mask material with radiation of a first selected wavelength range to form a first affected region to a preselected first depth in the first layer of mask material.

28. The method of claim 27, wherein irradiating at least a portion of the second layer of mask material to form a second affected region in the second layer of mask material comprises irradiating at least a portion of the second layer of mask material with radiation of a second selected wavelength range to form a second affected region to a preselected second depth in the second layer of mask material.

29. The method of claim 24, further comprising removing the first and second affected regions from the first and second layers of mask material to form an etch profile in the first and second layers of mask material.

30. The method of claim 24, further comprising removing the first and second affected regions of the first and second layers of mask material to form an etch profile in the first and second layers of mask material.

31. The method of claim 17, further comprising, after performing an anisotropic etching process to form an etched region in the process layer, removing an excess of mask material above an upper surface of the process layer.

32. A method for forming a conductive interconnect, comprising:

forming a process layer over a structure layer;

forming a mask over the process layer, the mask having a stepped etch profile formed therein by irradiating at least a portion of the mask with radiation of at least a first and second selected energy range generated by a radiation source, wherein forming the mask over the process layer comprises forming a layer of photoresist material over the process layer and forming a stepped etched profile in the layer of photoresist material;

performing an anisotropic etching process to erode the mask and to form an etched region in the process layer, the etched region having a profile correlating to the stepped etch profile;

forming a conductive material in the etched region in the process layer; and removing an excess conductive material from above an upper surface of the process layer.

33. The method of claim 32, wherein forming a process layer over a structure layer comprises forming a process layer of a dielectric material over a structure layer.

34. The method of claim 33, wherein the dielectric material comprises at least one of silicon dioxide and silicon oxynitride.

35. The method of claim 32, wherein the photoresist material comprises a positive photoresist material.

36. The method of claim 32, wherein the stepped etch profile comprises a via etch profile and a trench etch profile.

37. The method of claim 36, wherein the via etch profile overlaps the trench etch profile.

38. The method of claim 32, wherein forming a mask over the process layer, the masking having an etch profile therein, comprises:

forming a layer of mask material over the process layer;

irradiating at least a portion of the layer of mask material to form a first affected region in the layer of mask material;

irradiating at least a portion of the layer of mask material to form a second affected region in the layer of mask material; and removing the first and second affected regions from the layer of mask material to form an etch profile in the layer of mask material.

39. The method of claim 38, wherein irradiating at least a portion of the layer of mask material to form a first affected region in the layer of mask material comprises irradiating at least a portion of the layer of mask material with radiation of a first selected energy range to form a first affected region to a preselected depth in the layer of mask material.

40. The method of claim 39, wherein irradiating at least a portion of the layer of mask material to form a second affected region in the layer of mask material comprises irradiating at least a portion of the layer of mask material with radiation of a second selected energy range to form a second affected region to a preselected second depth in the layer of mask material.

41. The method of claim 40, wherein removing the first and second affected regions from the layer of mask material to form an etch profile comprises:

removing the first affected region from the layer of mask material to form a trench etch profile; and removing the second affected region from the layer of mask material to form a via etch profile.

42. The method of claim 40, wherein removing the first and second affected regions from the layer of mask material to form an etch profile comprises:

removing the first affected region from the layer of mask material to form a via etch profile; and removing the second affected region from the layer of mask material to form a trench etch profile.

43. The method of claim 38, wherein removing the first and second affected regions from the layer of mask material to form an etch profile comprises:

removing the first affected region from the layer of mask material to form a trench etch profile; and removing the second affected region from the layer of mask material to form a via etch profile.

44. The method of claim 38, wherein removing the first and second affected regions from the layer of mask material to form an etch profile comprises:

removing the first affected region from the layer of mask material to form a via etch profile; and removing the second affected region from the layer of mask material to form a trench etch profile.

45. The method of claim 32, wherein forming a conductive material in the etched region in the process layer comprises:

forming a barrier layer above an upper surface of the process layer and in the etched region in the process layer; and forming a conductive material above the barrier layer.

46. The method of claim 45, wherein forming a conductive material above the barrier layer comprises forming a layer of copper by performing an electroplating technique.

47. The method of claim 46, wherein removing an excess conductive material from above an upper surface of the process layer comprises removing an excess conductive material from above an upper surface of the process layer by performing a chemical mechanical polishing process.

48. The method of claim 32, wherein removing an excess conductive material from above an upper surface of the process layer comprises removing an excess conductive material from above an upper surface of the process layer by performing a chemical mechanical polishing process.

\* \* \* \* \*